United States Patent [19]

Narumiya et al.

[11] Patent Number: 5,077,575
[45] Date of Patent: Dec. 31, 1991

[54] IMAGE FORMING APPARATUS EQUIPPED WITH A BUCKET FOR ACCOMMODATING A PHOTOSENSITIVE SHEET CARTRIDGE

[75] Inventors: Masao Narumiya, Shiki; Tsuyoshi Takeno; Fumio Shimazu, both of Yamatokoriyama, all of Japan

[73] Assignee: Sharp Kabushiki Kaisha, Osaka, Japan

[21] Appl. No.: 626,637

[22] Filed: Dec. 7, 1990

[30] Foreign Application Priority Data

Dec. 13, 1989 [JP] Japan .................................. 1-323589

[51] Int. Cl.⁵ ............................................. G03B 27/58
[52] U.S. Cl. ......................................... 355/72; 352/72; 354/275; 355/213
[58] Field of Search .......................... 355/72, 211, 213; 352/72, 74; 354/275

[56] References Cited

U.S. PATENT DOCUMENTS

| 3,829,208 | 8/1974 | van Meijel et al. | 355/3 |
| 4,218,135 | 8/1980 | Tsuda et al. | 355/72 |
| 4,399,209 | 8/1983 | Sanders et al. | 430/138 |
| 4,530,588 | 7/1985 | Kimura et al. | 355/213 |
| 4,708,455 | 11/1987 | Kubota et al. | 355/213 |
| 4,914,479 | 4/1990 | Ogura et al. | 355/213 |
| 4,918,482 | 4/1990 | Ogura | 355/72 X |
| 4,965,622 | 10/1990 | Ibuchi | 355/72 X |
| 4,984,016 | 1/1991 | Makino et al. | 355/72 |
| 5,006,884 | 4/1991 | Kazuhito et al. | 355/72 X |
| 5,006,887 | 4/1991 | Ogura | 355/72 |
| 5,021,824 | 6/1991 | Higashi et al. | 355/72 |

FOREIGN PATENT DOCUMENTS 270644  3/1990  Japan .

Primary Examiner—Richard A. Wintercorn
Attorney, Agent, or Firm—David G. Conlin; Robert M. Asher

[57] ABSTRACT

An image forming apparatus which includes a bucket for accommodating a cartridge holding a roll of a photosensitive sheet and a take-up shaft for taking up the photosensitive sheet after use, the bucket having an exposure plate disposed above the cartridge, a slidable means engageable with a slidable means provided on the image forming apparatus so as to enable the bucket to be slidably mounted in and dismounted from the image forming apparatus, and a positioning means for securing the exposure plate in its optically proper position.

3 Claims, 3 Drawing Sheets

IMAGE FORMING APPARATUS EQUIPPED WITH A BUCKET FOR ACCOMMODATING A PHOTOSENSITIVE SHEET CARTRIDGE

BACKGROUND OF THE INVENTION

1. Field of the Invention

The present invention relates to an image forming apparatus equipped with a media bucket for accommodating a photosensitive sheet cartridge provided with a supply shaft for delivering a photosensitive sheet, and a take-up shaft for taking up the photosensitive sheet after use. The photosensitive sheet cartridge will hereinafter be called the "cartridge".

2. Description of the Prior Art

Japanese Laid-Open Patent Publication No.58-88739 discloses a method of forming an image by using a photosensitive sheet coated with microcapsules containing photosetting materials and image forming agent and an image receiving sheet coated with a developer that reacts with the image forming agent to develop colors. When the photosensitive sheet is exposed to light, the microcapsules are caused to harden on light-hit spots, thereby forming a latent image on the photosensitive sheet. When the image receiving sheet is superposed over the latent image and pressed together by a press roller unit, unhardened microcapsules rupture and enable the image forming agent contained therein to flow out and react with the developer to develop colors, thereby forming a colored image on the image receiving sheet.

This conventional image forming method is provided with a cartridge for accommodating the photosensitive sheet in a roll form so as to protect the microcapsules from being subjected to accidental exposure to light or rupturing before the expected exposure.

Where the cartridge is provided, a bucket is slidably mounted in the image forming apparatus so as to facilitate the mount and dismount of the cartridge. The bucket is drawn, and an exposure plate fixed thereto by means of fasteners such as screws, is removed so as to load a cartridge in the bucket. Then, the exposure plate is returned to the bucket and fixed thereto by means of screws, etc. A top portion of the photosensitive sheet is pulled from the cartridge over the exposure plate so as to make it ready for automatic delivery into a feed path. Finally, the bucket is inserted into the image forming apparatus.

The conventional method is disadvantageous in that the dismount and mount of the bucket involves a complicated and labor-consuming task which consists of drawing the bucket, removing the exposure plate, loading the cartridge, returning the exposure plate, setting the photosensitive sheet, and mounting the bucket again. During the work small accidents often happen such as losing screws, accidentally breaking the cartridge, and entangling the photosensitive sheet.

SUMMARY OF THE INVENTION

The image forming apparatus of this invention, which overcomes the above-discussed problems and numerous other disadvantages and deficiencies of the prior art, comprises a bucket for accommodating a cartridge holding a roll of photosensitive sheet and a take-up shaft for taking up the photosensitive sheet after use, the bucket comprising an exposure plate disposed above the cartridge, a slidable means engageable with a slidable means provided on the image forming apparatus so as to enable the bucket to be slidably mounted in and dismounted from the image forming apparatus, and a positioning means for securing the exposure plate in its optically proper position.

In another embodiment, the exposure plate is pivotally connected to an upper part of the bucket so as to swing in the opening and closing direction with respect to the cartridge.

In a further preferred embodiment, the positioning means comprises a pair of guide members disposed on each side of the bucket, and a pair of rails disposed on the image forming apparatus, the guide members and the rails being engageable with each other.

Thus, the invention described herein makes possible the objectives of (1) providing an image forming apparatus which facilitates the replacement of a used cartridge with a fresh cartridge, and (2) providing an image forming apparatus which constantly secures the exact focusing point for an image on the photosensitive sheet.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 4:
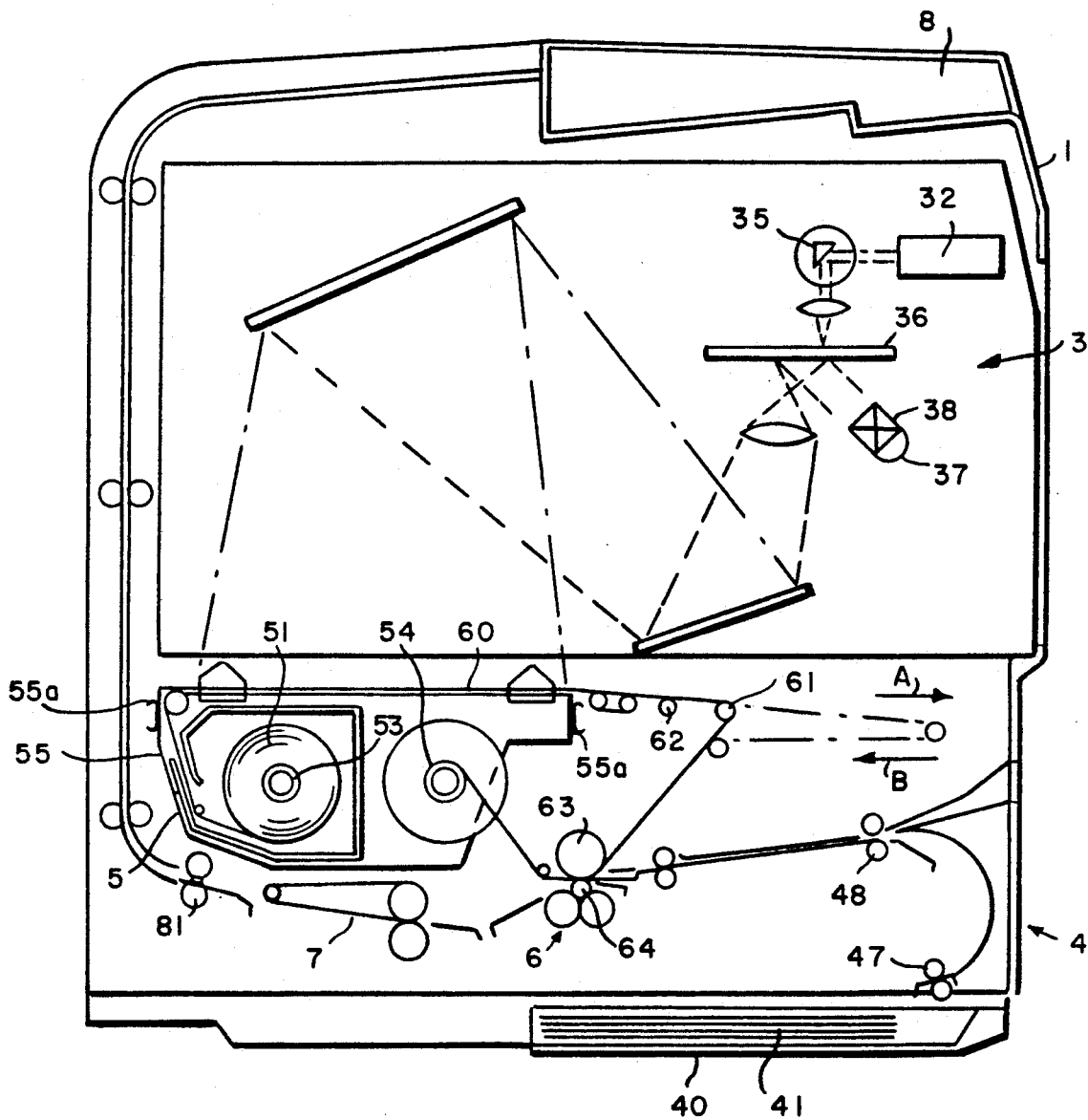
FIG. 4 is a cross-sectional view showing the internal structure of the image forming apparatus according to the invention.

Referring to FIG. 4, the image forming apparatus of the invention uses a photosensitive sheet coated with microcapsules containing photosetting materials and an image forming agent and an image-bearing sheet coated with a thermoplastic resin and a developer that reacts with the image forming agent to develop colors.

In the upper part of the image forming apparatus 1, there is disposed an optical system 3 that includes a semiconductor laser 32, a prismatic mirror 35, a liquid crystal screen 36, a lamp 37, a filter 38, and other related components. A photosensitive sheet 51 that is wound around a supply shaft 53 and housed in a cartridge 5 is delivered through a feed path before being wound around a take-up shaft 54. The cartridge 5 and the take-up shaft 54 are detachably mounted in the bucket 55 which is inserted into the image forming apparatus along slidable guide members 55a provided on the outside of the bucket 55. Disposed in the photosensitive sheet feed path are an exposure plate 60, an automatic transport roller 62, a buffer roller 61, and a pair of press rollers 63 and 64. The exposure plate 60 is swingably mounted on the bucket 55. Disposed at an appropriate place in the image forming apparatus 1 (in the illustrated embodiment, at a bottom) is a cassette 40 holding receiving sheets 41. A paper feed roller 47 and a timing roller 48 are disposed in the feed path of the image receiving sheet 41 from the cassette 40 to a pressure development section 6. A gloss-imparting unit 7 is disposed to the left of the pressure development section 6, to the left of which a paper discharging roller 81 is disposed. A paper discharging section 8 is provided in the upper part of the image forming apparatus 1.

The image forming apparatus is operated as follows:

Light beams generated by the semiconductor laser 32 are directed by the optical system 3 that consists mainly of the prismatic mirror 35 and the liquid crystal screen 36, so as to strike onto the photosensitive sheet 51 on the exposure plate 60. At this stage the buffer roller 61 is moved in the direction (A). By exposure, the microcapsules in an area where the light strikes harden, thereby forming a latent image in that area. When the exposure is finished, the take-up shaft 54 is rotated, which causes the buffer roller 61 to return in the direction of arrow (B) to transport the latent image formed on the photosensitive sheet to the pressure development section 6. Synchronized with the transport of the latent image, the image-receiving sheet 41 is fed from a paper feed section 4 toward the pressure development section, so that the photosensitive sheet 51 and the image-receiving sheet 41 are passed between the press rollers 63 and 64 for pressing together. As a result, unhardened microcapsules on the image-receiving sheet 41 rupture and cause the image forming agent contained therein to flow out and react with the developer on the image-receiving sheet 41 to develop colors. The image-receiving sheet 41 on which the pressure development is completed is wound around the take-up shaft 54, while the image-receiving sheet 41 is thermally treated by the gloss-imparting unit 7 and transported by means of the paper discharging roller 81 to the paper discharging section 8 from which the image-receiving sheet 41 is discharged to the outside of the image forming apparatus 1.

Figure 1A:
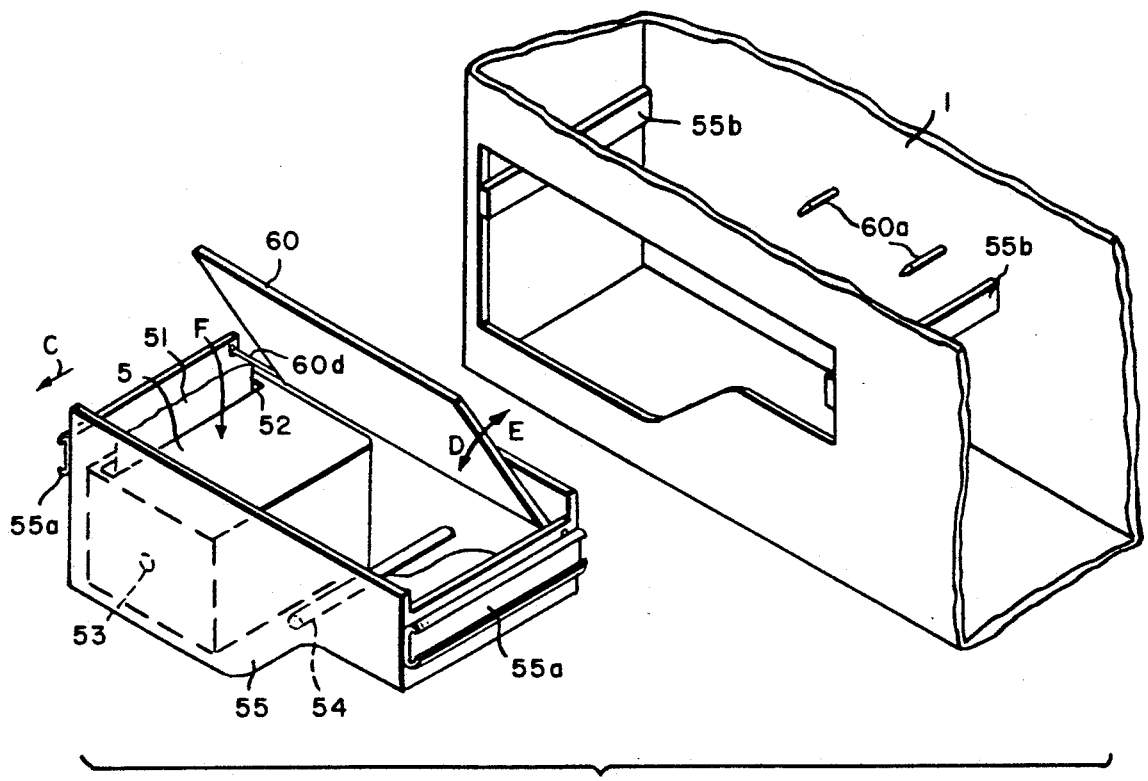
FIGS. 1(A) to 1(C) are perspective views showing the steps of exchanging a used cartridge with a fresh one in an image forming apparatus according to the present invention.

Next, the procedure for exchanging a used cartridge with a fresh one will be described:

FIG. 1(A) shows the state at which a bucket 55 is drawn from the image forming apparatus 1 and the exposure plate 60 is opened. A pair of slidable guide members 55b are provided in the image forming apparatus 1, extending crosswise thereof. A pair of guide pins 60a are provided for positioning the exposure plate 60 in an appropriate position. A pair of slidable guide members 55a are provided on the outside of the bucket 55, and a pair of guide members 55b are provided on the image forming apparatus 1. The guide members 55a are engaged with the guide members 55b, thereby securing the union of the bucket 55 and the image forming apparatus 1. The bucket 55 accommodates the cartridge 5 in which the photosensitive sheet 51 is wound around the supply shaft 53 contained in the cartridge 5. The photosensitive sheet 51 is taken out through a delivery opening 52. The take-up shaft 54 is detachably mounted in the bucket 55 toward the image forming path. The exposure plate 60 is attached to the inside of the bucket 55 in such a manner that it can swing on a support 60d in the directions of arrows (D) and (E) as widely as possible.

Figure 1B:
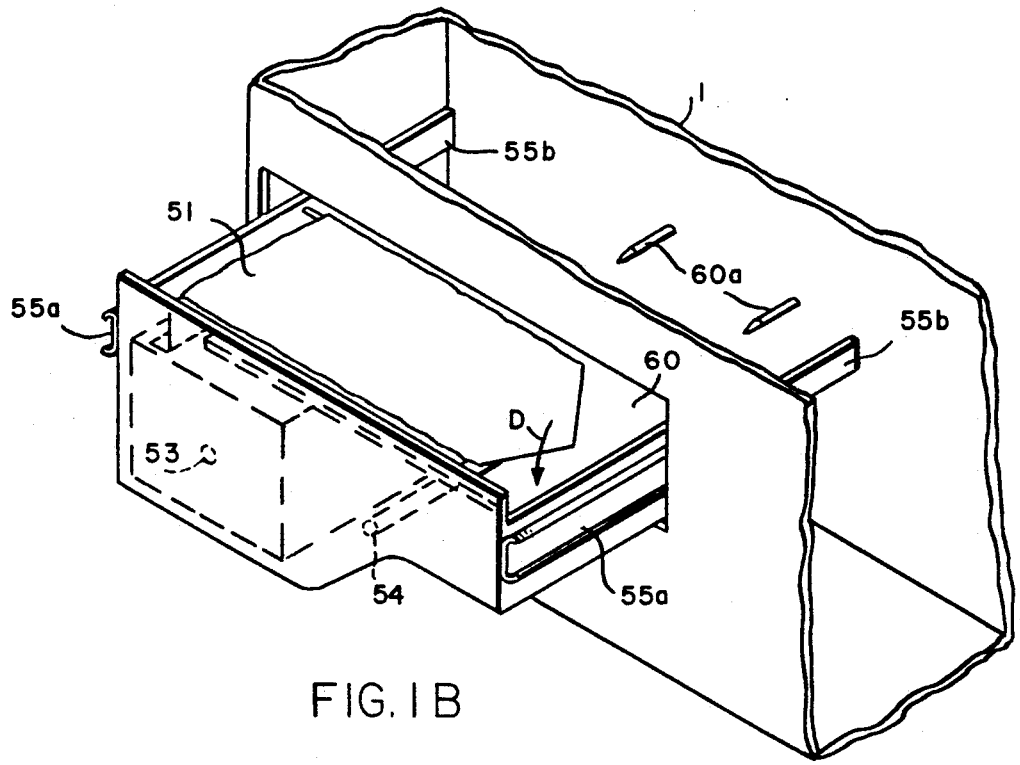
Figure 1C:
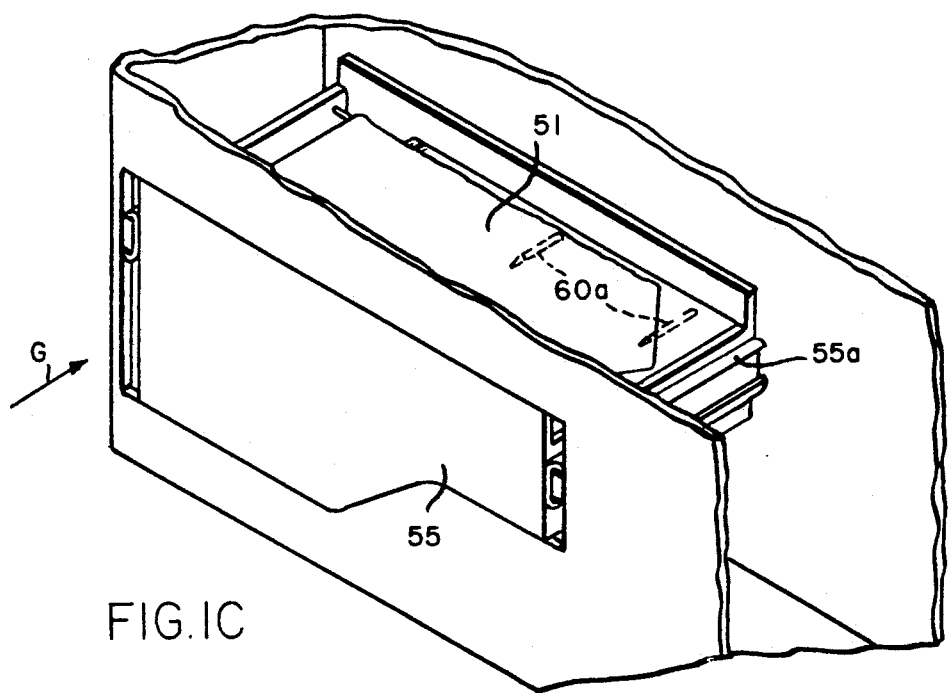
Figure 2A:
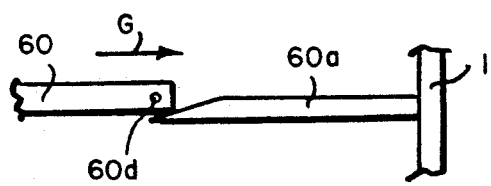
FIGS. 2(A) and 2(B) are schematic views showing the state at which a guide pin guides an exposure plate.
Figure 2B:
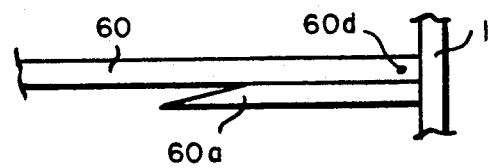

To replace the cartridge 5 with a fresh one, the bucket 55 is drawn out of the image forming apparatus 1 in the direction of arrow (C), and the exposure plate 60 is opened in the direction of arrow (E) as shown in FIG. 1(A). Then, a fresh cartridge 5 is inserted in the bucket 55 in the direction of arrow (F) from above. Next, as shown in FIG. 1(B), the exposure plate 60 is closed in the direction of arrow (D), and a top portion of the photosensitive sheet 51 is pulled out so as to be placed over the exposure plate 60. After the cartridge 5 is set, the bucket 55 is inserted into the image forming apparatus 1 in the direction of arrow (G). The insertion of the bucket 55 into the image forming apparatus 1 is facilitated by the engaged slidable guide members 55a and rail members 55b. As shown in FIGS. 2(A) and 2(B), the exposure plate 60 is caused to ride on the guide pins 60a along their tapered ends, and locate itself at a proper exposure position. This arrangement of the invention eliminates the necessity of any subsequent adjustment, thereby contributing to labor-saving. Furthermore, since the exposure plate 60 can be precisely positioned, the focusing point is determined for production of a clear image.

More specifically, referring to FIG. 2, the exposure plate 60 is guided by the guide pins 60a fixed on the inside wall of the image forming apparatus 1. When the bucket 55 is pushed in the direction of arrow (G), the exposure plate 60 slides along the tapered surfaces of the end portions of the guide pins 60a as shown in FIG. 2(A) and caused to ride on the guide pins 60a and is fixed in position as shown in FIG. 2(B). The reference numeral 60d indicates a support about which the exposure plate 60 turns and which moves up and down in elongated holes provided in the side wall of the bucket 55, thereby adjusting the position of the exposure plate 660 vertically.

Figure 3A:
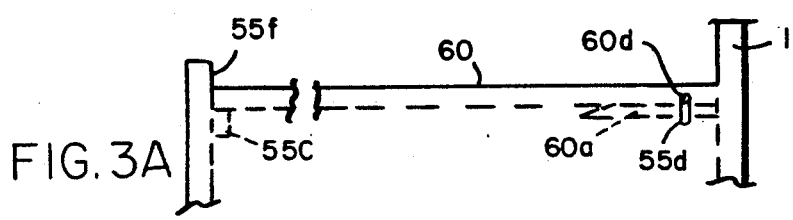
FIGS. 3(A) and 3(B) are schematic views showing the state at which the exposure plate moves with respect to the bucket.
Figure 3B:
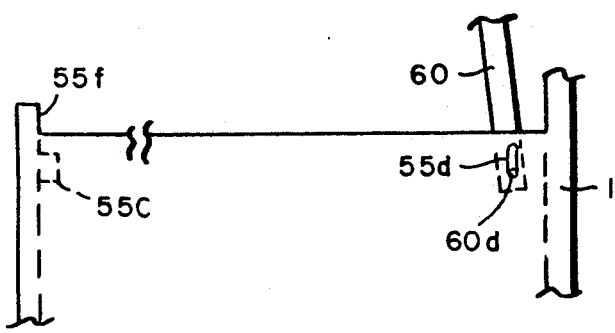

FIG. 3 shows the functions of the elongated hole in the side wall of the bucket 55 and the support 60d for the exposure plate 60 in the image forming apparatus 1. FIG. 3(A) shows a state in which the exposure plate 60 is closed. The exposure plate 60 is held in position, one side thereof resting on a stopper 55c provided on a front frame 55f of the bucket 55 and the opposite side thereof being positioned on the guide 60a as described above. The support 60d for the exposure plate 60 is fitted in the elongated holes 55d provided in the side wall of the bucket 55, and is moved up and down in and along the elongated holes 55d, thereby positioning the exposure plate 60 precisely. FIG. 3(B) shows a state in which the exposure plate 60 is opened. The support 60d moves in and along the elongated holes 55d so that the exposure plate 60 is opened as widely as possible.

In this embodiment, the exposure plate 60 is rotatably connected to the side wall of the bucket 55 by means of the support 60d, but it can be mounted in any convenient manner if it allows the cartridge 5 to be mounted in the bucket 55 easily, and if it allows the exposure plate 60 to be located precisely. The positioning of the exposure plate 60 can be achieved precisely by other means than the guide pins proposed in this embodiment.

According to the present invention, the exposure plate 60 can be easily opened and closed, thereby facilitating the replacement of cartridges. The bucket can be easily returned to the image forming apparatus so that the exposure plate takes its proper position under the guidance of the guide members and rails, thereby avoiding the misalignment of the focussing point of an image with respect to the photosensitive sheet.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An image forming apparatus comprising a bucket for accommodating a cartridge holding a roll of photosensitive sheet and a take-up shaft for taking up the photosensitive sheet after use, the bucket comprising an exposure plate disposed above the cartridge, a slidable means engageable with a slidable means provided on the image forming apparatus so as to enable the bucket to be slidably mounted in and dismounted from the image forming apparatus, and a positioning means for securing the exposure plate in its optically proper position.

2. An image forming apparatus according to claim 1, wherein the exposure plate is pivotally connected to an upper part of the bucket so as to swing in the opening and closing direction with respect to the cartridge.

3. An image forming apparatus according to claim 1, wherein the positioning means comprises a pair of guide members disposed on each side of the bucket, and a pair of rails disposed on the image forming apparatus, the guide members and the rails being engageable with each other.

* * * * *